Sept. 10, 1963 B. FONOROFF ET AL 3,103,061

METHOD OF HANDLING SMALL LEAD WIRES

Filed Oct. 5, 1960 2 Sheets-Sheet 1

INVENTORS
BERNARD FONOROFF
EGONS RASMANIS
BY Wilfred G. Caldwell
ATTORNEYS

METHOD OF HANDLING SMALL LEAD WIRES

Filed Oct. 5, 1960 2 Sheets-Sheet 2

INVENTORS
BERNARD FONOROFF
EGONS RASMANIS
BY
Amster & Levy
ATTORNEYS 3,103,061

METHOD OF HANDLING SMALL LEAD WIRES

Bernard Fonoroff, Bedford, and Egons Rasmanis, Burlington, Mass., assignors to Columbia Broadcasting System, Inc., Danvers, Mass., a corporation of New York Filed Oct. 5, 1960, Ser. No. 60,750
9 Claims. (Cl. 29—155.55)

The present invention relates generally to the manufacture of semiconductor devices and specifically to devices for handling the fine lead wires which are mechanically and electrically connected to the various components of semiconductor devices.

In the manufacture of semiconductor devices a variety of problems arise due to the relatively small size of the various components employed. One of the most difficult of these problems is the handling during manufacture of the very fine wires which are electrically and mechanically connected to the components of the semiconductor device. As the use of semiconductors has increased in the electronics industry, this problem has become a highly significant one in the manufacture of transistors and other semiconductor devices. With this marked increase in the use of semiconductor devices, the demand for automation in their manufacture has required that the heretofore employed hand methods be dispensed with in favor of mass production techniques.

It is advantageous in the manufacture of many differing semiconductor devices to employ gold lead wires having diameters of the order of 0.0004 inch. The fineness and brittleness of such wire has presented serious handling problems. In the past, many differing techniques have been employed, however, they ultimately depended upon skilled hand manipulation often employing the use of hand tweezers to position the wire with respect to a transistor header or the like. In addition to the obvious high cost of such hand techniques, the reliability of semiconductor devices produced in this manner has not fulfilled the high standards which are required in the electronics industry. Due to the tremendous difficulty in handling such fine lead wires, the repeatability of any given operation is inherently limited by the skill of the operator in handling a wire of very small diameter.

It is an object of the present invention to provide a means and technique to fill the demand for a superior method of handling small wires in general and specifically for a method and means to handle small lead wires in the manufacture of semiconductor devices.

It is within the contemplation of the present invention to provide a means and technique for handling a wire of relatively small diameter and for locating and transporting same in the manufacture of semiconductor devices.

It is still a further object of the present invention to provide a method for handling small lead wires and for locating said small lead wires with respect to semiconductor devices for attaching said wires thereto.

It is still a further object of the present invention to provide a combined lead wire and handling means whereby lead wires of small diameter may be easily and reliably handled in the manufacture of semiconductor devices.

It is further within the contemplation of the present invention to provide means and a method for handling small lead wires in the manufacture of semiconductor devices whereby the attachment of said lead wires to the semiconductor devices may be accomplished on an automated mass production basis.

In accordance with the present invention there is provided a means for handling small lead wires in the manufacture of semiconductor devices comprising a handling strip having a series of spaced openings formed therein. A small diameter wire, adapted to be used as lead wire for such semiconductor devices, is in operative engagement with the handling strip such that portions of the wire pass across the openings while alternate portions of the wire are securely engaged with the body of the handling strip. The assembly of a handling strip and an attached wire is advantageous in positioning and locating the lead wire with respect to semiconductor devices and in addition, the openings in the handling strip provide access room by means of which the lead wires may be brought into contact with mesa contacts or the like on semiconductor devices.

Further, there is provided in accordance with the present invention a device for handling small lead wires for connection to the semiconductor devices comprising a handling strip having a series of spaced apart openings formed therein. A sheathed wire, of the type having an outer metallic skin and an inner metallic core of a more noble metal than in the outer skin, is securely connected to the handling strip such that portions of the wire cross the openings in the handling strips and alternate portions of the wire are securely attached thereto. Means are provided to completely encapsulate those portions of the sheathed wire which are in direct contact with the body of the handling strip, those portions which cross the opening being left free from obstruction such that when the assembly is exposed to an etching medium the less noble exposed skin will be removed exposing the core wire.

In accordance with method aspects of the present invention there is provided a process for handling small lead wires in the attachment thereof to semiconductor devices. This method comprises the steps of forming a series of spaced openings in a handling strip and securing a sheathed wire thereto such that the sheathed wire alternatively crosses open and solid portions of the handling strip. Those portions of the sheathed wire which are in direct contact to the body of the handling strip are then completely encapsulated, those portions of the wire crossing the openings being left free from obstruction. The assembly of handling strip and sheathed wire is exposed to an etching medium wherein the skin of the exposed portion of the wire is removed uncovering the small diameter core which is adapted for use as lead wires for semiconductor devices. The handling strip is then utilized to transport, handle and locate the wire core with respect to a semiconductor device for electrical and mechanical attachment thereto.

The above brief description, as well as further objects, features and advantages of the present invention will be best appreciated by reference to the following detailed description of a presently preferred embodiment when taken in conjunction with the accompanying drawings wherein:

FIGS. 1 through 4 illustrate the process of forming one handling device according to the present invention.

Specifically:

Figures 1, 2:
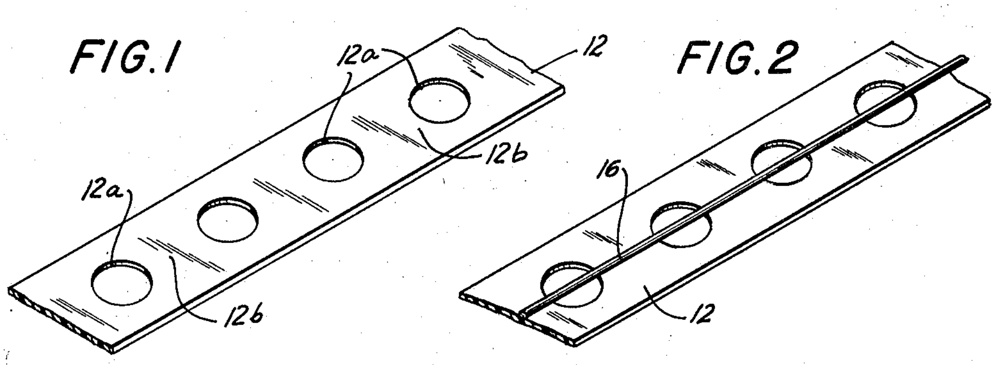
FIG. 1 is a perspective view of a first strip member with a series of openings therein.
FIG. 2 is a perspective view similar to FIG. 1 showing a sheathed wire placed upon the first strip member and crossing the openings.
Figures 3, 4:
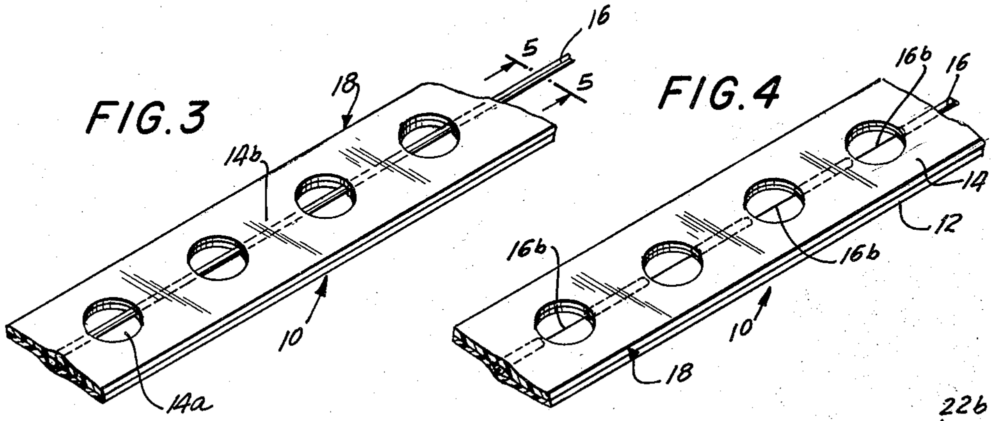
FIG. 3 is a perspective view similar to FIG. 2 showing a second strip member placed on and laminated to the first strip member.
FIG. 4 is a perspective view showing the device shown in FIG. 3 after exposure to an etching medium showing the uncovered core of the sheathed wire.
Figures 5, 6:
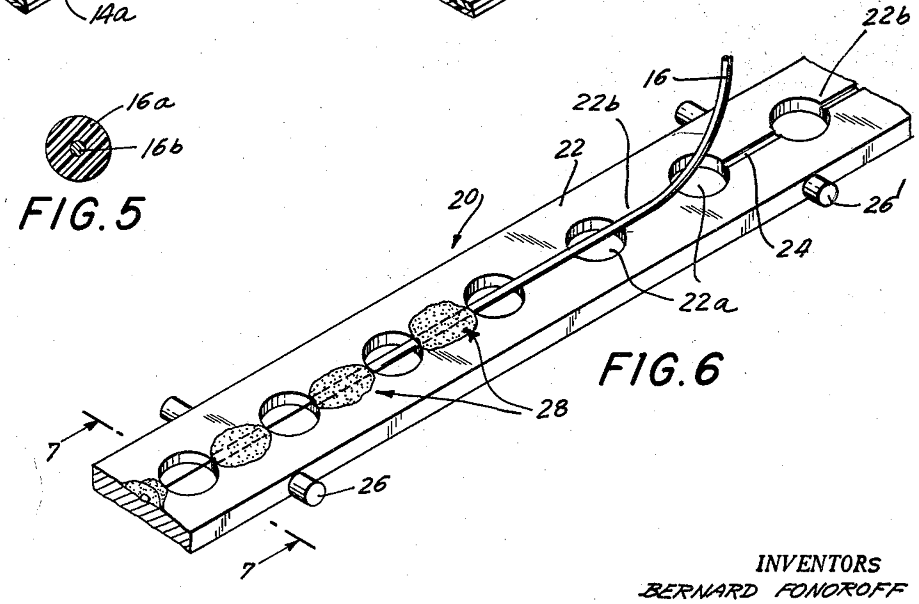
FIG. 5 is an enlarged sectional view of the sheathed wire utilized in the device shown in FIG. 4.
Figure 7:
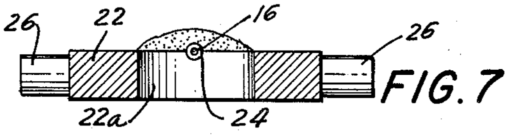
Figures 8, 9:
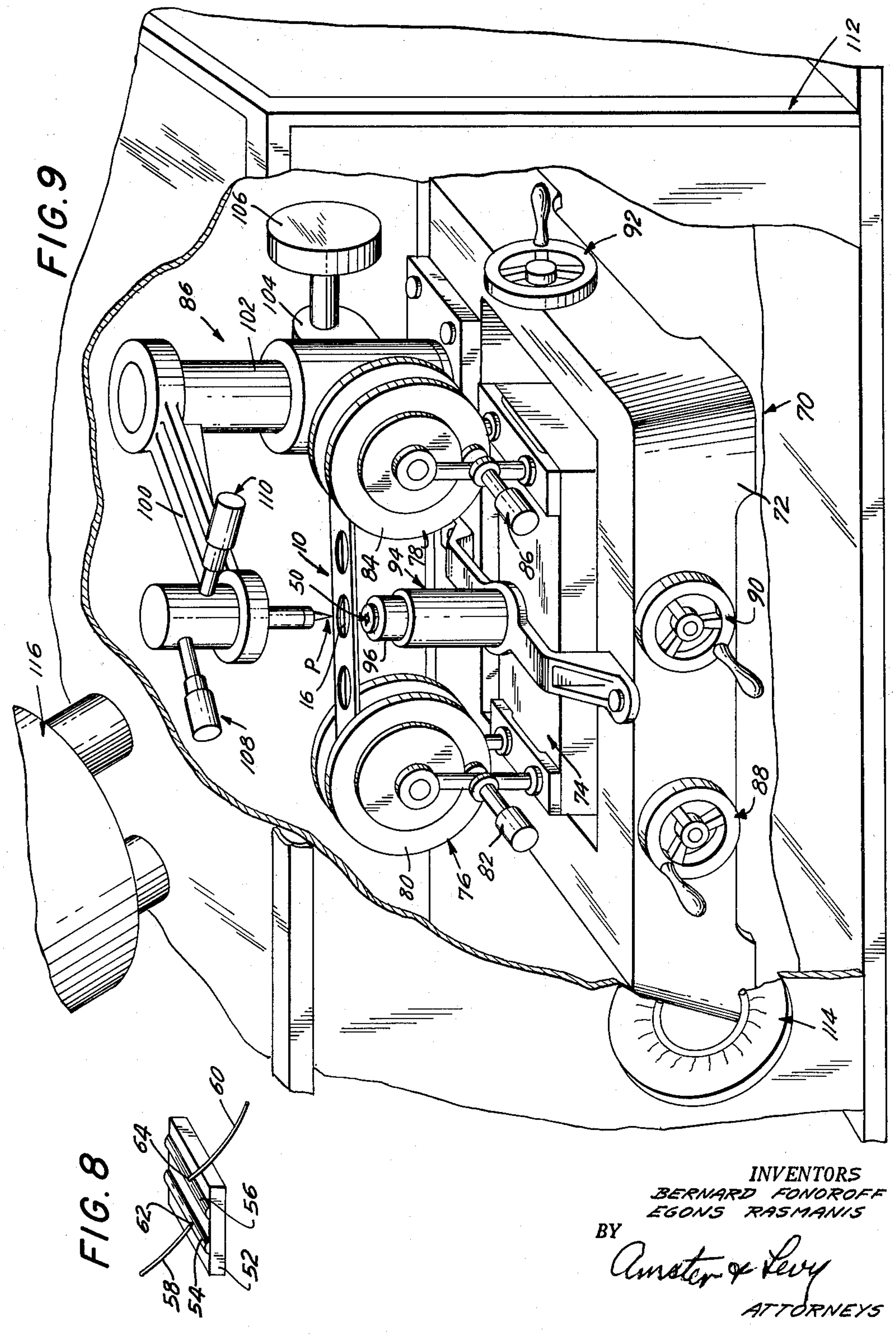

FIG. 6 is a perspective and diagrammatical view of a second embodiment of the present invention showing a rigid handling strip illustrating various steps in the manufacture thereof. The handling strip is progressively illustrated as having openings and a groove formed therein, having a coated wire positioned thereon, having a bonding agent securing the wire to the strip body and finally having been passed through an etching medium to uncover the core of the sheathed wire;

FIG. 7 is an enlarged sectional view taken along the line 7—7 of FIG. 6 and looking in the direction of the arrows;

FIG. 8 is a perspective view of a portion of a mesa-type transistor having lead wire attached to the mesa contacts; and, FIG. 9 is a perspective view, with portions broken away for the sake of clarity, showing an illustrative set up illustrating the lead wire handsing device of FIG. 4 in use applying a lead wire to a mesa transistor.

Referring now specifically to the drawings, there is shown in FIGS. 1 through 4 a process for forming a lead wire handling strip generally designated by the numeral 10 and illustrated in its finished form in FIG. 4. The lead wire handling strip 10 is comprised of a first strip member 12, a second strip member 14 laminated thereto, and a sheathed metallic wire 16 positioned therebetween.

The first strip member 12 and the second strip member 14, are formed of relatively thin extended sheets of a flexible material. The use of Teflon tape as the material for the strip members 12, 14 has been quite successful due to its durability, flexibility, and insensitivity to the etching medium to which the tapes are exposed, as will be explained below. A series of spaced apart openings **12*a* are formed longitudinally of the first strip member 12 such that alternate solid portions 12*b* are formed therebetween. The second strip member 14 is identical to the first strip member 12 and has formed in it a series of openings 14*a* thus producing a series of alternate solid portions 14*b***.

After formation of the openings **12*a* in the first strip member 12, a sheathed wire 16 is placed thereon such that it alternately engages the solid portions 12*b* of the strip 12 and crosses the openings 12*a***.

The second strip member 14 is then placed upon the assembled first strip member 12 and sheathed wire 16 such that the openings **14*a* in the second strip member 14 exactly register with the similar openings 12*a* in the first strip member 12. The two strip members 12, 14 are then laminated together by the use of an adhesive or by any other convenient laminating process, e.g., as by thermoplastic techniques. The resultant assembly as shown in FIG. 3 of the drawings, has a solid tape structure 18, made up of the two strip members 12, 14 which carry the sheathed wire 16 within the tape 18, portions of the wire 16 being exposed and unobstructed at the registered openings 12*a*, 14*a***.

The construction of the wire 16 is best seen in the sectional view of FIG. 5. The wire 16 is a sheathed wire having an outer skin **16*a* of one metallic material and an inner skin 16*b* of a more noble metal. In this illustrative embodiment the outer skin 16*a* is silver and the core 16*b* is gold. This form of wire is generally known as Wollaston wire having an approximate overall diameter of 0.002 inch or larger for the skin 16*a*, the core 16*b* having a diameter of 0.0004 inch. It will be appreciated that upon exposure to a suitable etching medium the skin 16*a*, composed of silver, will be more perceptible to attack than will the more noble gold core 16*b*. Exposure of the lead wire handling device 10 as shown in FIG. 3, to an etching medium is therefore effective to remove the skin 16*a* and to expose the core wire 16*b*. It has been found that the use of 50% solution of nitric acid is excellent to selectively etch away the silver skin 16*a* leaving the unetched gold core wire 16*b*. The resultant lead wire handling strip 10 is illustrated in FIG. 4 wherein the solid tape structure 18 has embedded within it a wire 16 which alternately passes through the solid portion and across the open portions of the tape structure 18. The exposed portion of the wire 16 is, after the etching process, the fine 0.0004 inch gold core wire 16*b***.

The lead wire handling strip 10 as shown in FIG. 4, may be used to accurately and easily position the fine 0.0004 inch lead wire with respect to transistor diodes for attachment thereto. It will be appreciated that the use of the lead wire handling strip 10 provides means for the easy handling of extremely fine wire. It will be further appreciated that the use of the lead wire handling strip 10 provides means to attach lead wires to semiconductor devices by automated mass production techniques. Whereas heretofore known techniques employ the use of hand methods, including the use of hand tweezers, to position the lead wires in the manufacture of semiconductor devices, the lead wire handling strip 10 may be placed within an automated machine for the accurate and quick placement of the lead wires with respect to transistor headers and the like.

A typical semiconductor device 50 is illustrated in FIG. 8 of the drawings and comprises a base 52 and mesa contacts 54, 56. Lead wires 58, 60, of wire such as the core wire 16 carried by the lead wire handling strip 10, are secured to the mesa contacts 54, 56 respectively by thermo-compression bonds at 62, 64. It will be appreciated that the mesa transistor 50 is merely illustrative of the large class of semiconductor devices on to which small lead wires are attached.

In FIG. 9 there is shown an illustrative assembly device wherein the lead wire handling strip 10 is utilized in a thermal compression assembly device generally designated by the numeral 70. The assembly device 70 is not the central subject of the present invention and will therefore not be described in detail. It is sufficient to note that there is provided a frame 72 on which is mounted a movable carriage 74 on which is mounted the strip feed reel and take up reel assemblies 76, 78. The lead wire handling strip 10 is wound on reel 80 of the feed assembly 76 which is controlled by the feed control 82. The strip 10 is taken up by the take up reel 84 on the assembly 78 which is controlled by the feed control 86. As is seen in FIG. 9, the strip 10 is firmly held between reel 80 and reel 84. The strip 10 may be moved with a high degree of precision by the hand control wheels 88, 90, 92, which govern the movements of the carriage 74.

An electrically heated standard 94 is provided which is rigidly secured to the frame 72 and which is positioned below the handling strip 10. A mesa transistor 50 of the type shown in FIG. 8, is located within the holder 96 on the standard 94. The mesa transistor 50 is merely illustrative of the semiconductor devices which may be utilized in the assembly device 70.

It will be appreciated that upon the proper manipulation of the control wheels 88, 90, 92 the strip 10 may be accurately located with respect to the mesa contacts 62, 64 on the mesa transistor 50. The accuracy of this location is governed only by the accuracy of the movement mechanisms within the assembly device 70.

Thermal compression means, generally designated by the numeral 98, are provided and include an adjustable point P mounted on an arm 100 which in turn is mounted on a column 102 which is vertically movable in housing 104. A control mechanism is provided within the housing 104 and operable by means of the knob 106 to move the column 102 and therefore the point P through a vertical movement. Two fine adjustment means 108, 110 are provided at right angles to each other and provide means to adjust the horizontal position of the point P over the lead wire 16 and the transistor 50.

When the lead wire 16 has been accurately placed in proper position with respect to the transistor 50, the point P is placed over the intersection of the lead wire and the contact on the mesa transistor 50. The knob 106 is then turned which is effective to bring the point P in contact with the lead wire 16 and to apply pressure thereto. The combination of the pressure and the heat supplied by the standard 94 is sufficient to securely join the wire 16 to the transistor 50.

A covering shield 112 is provided over the assembly 70 and two hand holes 114 (only one shown) are provided for access. A microscope 116 is secured to the covering shield 112 to provide means for inspection.

It should be appreciated that the assembly device 70 is merely illustrative of a device in which the present invention may be advantageously utilized. It should further be appreciated that the lead wire handling strip 10 may be utilized in an assembly device basically similar to device 70 wherein the various operations of movement of the strip 10, location of the semiconductor 50 with respect to the wire 16, location of the point P and the compressive movement of the point P are all accomplished on an automatic basis.

Reference will now be made to FIGS. 6 and 7 for a description of a second illustrative embodiment of the present invention. A second lead wire handling device, generally designated by the numeral 20, employs a solid and rigid elongated base member 22 of a material such as stainless steel or a rigid plastic, which is both insensitive to attack by nitric acid, is adapted to withstand elevated temperatures and has a thermal coefficient of expansion which is close to that of the wire 16. A series of spaced apart openings 22*a* is provided along the length of the base member 22 and a series of solid portions 22*b* is left therebetween. A groove 24 is formed longitudinally of the base 22 and intersect each of the openings 22*a*. The diameter of the groove 24, which is substantially semi-cylindrical in shape, is approximately the diameter of the Wollaston wire 16 which will be placed therein as described below. Aligning lugs 26 are provided at intervals along the length of the base 22 to provide locating means for the lead wire handling device 20.

As diagrammatically shown in the successive stations of FIG. 5, a coated Wollaston wire 16 is placed within the groove 24 such that it is in intimate contact with the base 22 at the solid portions 22*b* thereof and crosses over the openings 22*a*. Those portions of the Wollaston wire 16 which are in contact with the solid portions 22*b* of the base 22 are then covered with a plastic, such as polystyrene, or a cement, such as Duco, manufactured by E. I. du Pont de Nemours, Inc. The cement or bonding agent, generally indicated by the numeral 28, is placed upon the wire 16 and the base 22 as shown in FIGS. 6 and 7 such that the portions of the wire 16 which are in contact with the solid portions 22*b* are completely encapsulated by the base 22 and the cement or bonding agent 28.

After the wire 16 has been secured to the base 22, the assembled lead wire or handling device 20 is exposed to an etching medium wherein the silver skin 16*a* of the wire 16 is removed as described above in connection with the lead wire handling strip 10. It will be appreciated that that portion of the wire 16 which is covered by the cement or bonding agent 28 will not be attacked by the etching medium. It will be further appreciated that the gold core 16*b* will be exposed in the areas where the wire 16 crosses the opening 22*a*, i.e., where the wire is not encapsulated by the cement 28 and the base 22.

The completed lead wire handling device 20, as best seen in the lower left hand portion of FIG. 6, is well adapted for use in mass production and automated manufacture of semi-conductor devices. The lead wire handling device 20 may be utilized to easily and conveniently locate the fine 0.0004 inch lead wires with respect to the headers of transistors and the like.

The assembly device 70, shown in FIG. 9 and discussed above, may be utilized, with slight adaptations, in conjunction with the handling device 20. The reel assemblies 76, 78 would be replaced with a transport device more suitably adapted to handle a rigid bar such as the handling device 20. It will be appreciated that the rigid base 22 of the handling device 20 provides a solid support for the lead wire 16*b* which is large enough to be conveniently handled by automatic or semiautomatic machinery and which provides firm locating means to position the wire 16*b*.

Although it has been stated that the body of the lead wire handling strip 10 and the lead wire handling device 20 are made respectively of a plastic such as Teflon or stainless steel, it should be appreciated that these devices may be constructed of any suitable material.

It should be further appreciated that the teachings of the present invention do not require the use of sheathed wire as shown in FIG. 5. A single strand of wire such as 16*b* may be utilized in a handling strip or handling device without the requirement of etching the assembly as described above.

A latitude of modification, substitution and change is intended in the foregoing disclosure and in some instances some features of the invention will be used without a use of other corresponding features. Accordingly, the claims herein should be construed broadly and in a manner consistent with the spirit and scope of the invention.

What we claim is:

1. A combined lead wire and handling device for use in the manufacture of semiconductor devices comprising a rigid base having formed therein a series of openings, said base including solid portions at opposite sides of said openings and a groove formed in said solid portions and crossing said openings, a sheathed wire positioned within said groove and extending across said openings, said sheathed wire including a core wire adapted to be used as a lead in said semiconductor devices and a metallic skin surrounding said core constructed of a metal less noble than said core wire, attachment means to secure said wire to said base and within said groove, said wire being encapsulated at said solid portions by said base and said attachment means, said core wire being exposed and free from obstructions at said openings, said core wire and said skin being rigidly held in said base.

2. A combined lead wire and handling device for use in manufacturing semiconductor devices comprising a body formed with a series of spaced-apart openings therein and including solid portions at opposite sides of said openings, a sheathed wire having a metallic core adapted for use as a lead and a skin of a less noble metal, said wire positioned on said body crossing said openings and engaging said solid portions, and means securing said wire to said body at said solid portions, said core of said wire being exposed and free from obstruction at said openings.

3. The method of handling lead wires for attachment to semiconductor devices comprising embedding within a handling strip a wire having a metallic core adapted for use as a lead and enclosed within a skin of a less noble metal, said handling strip having a series of spaced apart openings to leave alternate portions of said sheathed wire exposed, etching said assembled sheathed wire and handling strip to remove said skin and to expose said core, and transporting and locating said wire with respect to said semiconductor devices by said handling strip.

4. In the manufacture of a semiconductor device, the method of handling, locating and attaching lead wires comprising the steps of forming an opening in a first member, placing upon said first member and across said opening a sheathed wire of the type having an outer metallic skin and an inner core of a more noble metal than said outer skin such that said sheathed wire crosses said opening, forming an opening in a second member, laminating said second member to said first member with their respective openings in registry and with said sheathed wire sandwiched therebetween to form a lead wire handling device, said sheathed wire being exposed at said opening, subjecting said handling device to an etching medium to remove said outer skin and to uncover said core at the portions of said wire which are exposed at said opening such that said core may be utilized as a lead wire, transporting said wire core and locating said wire core with respect to said semiconductor device by said handling device, and securing said wire core to the semiconductor while maintaining same in position by said handling device.

5. In the manufacture of a semi-conductor device, the method of handling, locating and attaching lead wires comprising the steps of forming a plurality of spaced-apart openings in a first strip member, placing upon said first member a sheathed wire of the type having an outer metallic skin and an inner core of a more noble metal than said outer skin such that said sheathed wire crosses said openings, forming a plurality of openings in a second strip member corresponding to said openings in said first strip member, laminating said second strip member to said first strip member with their respective openings in registry and with said sheathed wire sandwiched therebetween to form a lead wire handling strip, portions of said sheathed wire being exposed at said openings and alternate portions of said sheathed wire encapsulated by said handling strip, subjecting said handling strip to an etching medium to remove said outer skin and to uncover said core of said sheathed wire at the portions of the said wire which are exposed at said openings such that said core may be utilized as a lead wire, transporting said wire core and locating said wire core with respect to said semiconductor device by said handling device, and securing said wire core to the semiconductor while maintaining same in position by said handling device.

6. In the manufacture of semiconductor devices the method of handling, locating and attaching lead wires comprising the steps of forming a plurality of openings in a first strip member, placing upon said first member a wire adapted for use as a lead such that said wire crosses said openings, forming a plurality of openings in a second strip member, said openings in said second strip member corresponding to said openings in said first strip member, laminating said second strip member to said first strip member with their respective openings in registry and with said wire sandwiched therebetween to form a lead wire handling strip, portions of said wire being exposed at said openings, and engaging said wire against the surface of said semiconductor device at the location to which said wire is to be attached by grasping said handling strip and moving same to bring said wire into contact with said semiconductor at said location, and welding said wire to said semiconductor device.

7. In the manufacture of semiconductor devices the method of handling lead wires for connection to said devices comprising the steps of forming a handling device having an opening formed therein and having a groove formed in one surface thereof which groove intersects said opening, placing a sheathed wire having a metallic core adapted to be used as a semiconductor device lead wire and a metallic skin of a metal less noble than said core within said groove and across said opening, bonding said wire to said handling device with a bonding agent which cooperates with said groove to encapsulate said wire, said wire being exposed at said opening, exposing the assembly of said handling device, said wire and said bonding agent to an etching medium to remove the exposed portion of said metallic skin of said wire and to uncover said core, and transporting said wire core and locating said wire core with respect to said semiconductor device by said handling device.

8. In the manufacture of semiconductor devices the method of handling lead wires for connection to said devices comprising the steps of forming an elongated handling strip having a plurality of spaced-apart openings formed longitudinally therein and having a groove formed in one surface thereof which groove intersects said openings, placing a sheathed wire having a metallic core adapted to be used as a semiconductor device lead wire and a metallic skin of a metal less noble than said core within said groove and across said openings, bonding said wire to said handling strip with a bonding agent which cooperates with said groove to encapsulate said wire, said wire being exposed at said openings, exposing the assembly of said handling strip, said wire and said bonding agent to an etching medium to remove the exposed portion of said metallic skin of said wire and to uncover said core, and engaging said wire against the surface of said semiconductor device at the location to which said wire is to be attached by grasping said handling strip and moving same to bring said wire into contact with said semiconductor at said location, and welding said wire to said semiconductor device.

9. A combined lead wire and handling device for use in the manufacture of semiconductor devices comprising an elongated body including a first member and a second member each of which has formed therein a plurality of spaced-apart, aligned openings with solid portions therebetween, said first and second members being laminated together with their respective openings in registry, a wire sandwiched between said first and second members, said wire alternatively crossing said openings and the solid portions therebetween, and a metallic sheathing about said wire along the portions of said wire which are in contact with said solid portions, said wire being free from obstructions at said openings.

References Cited in the file of this patent

UNITED STATES PATENTS

| | | |
|---|---|---|
| 378,423 | Baynes | Feb. 28, 1888 |
| 2,251,609 | Freeburg | Aug. 5, 1941 |
| 2,385,386 | Stoffel | Sept. 25, 1945 |
| 2,954,117 | Freeburg | Sept. 27, 1960 |
| 3,015,884 | Chamberlain | Jan. 9, 1962 |